(12) United States Patent
Karda et al.

(10) Patent No.: US 11,127,747 B2
(45) Date of Patent: Sep. 21, 2021

(54) TRANSISTORS INCLUDING TWO-DIMENSIONAL MATERIALS

(71) Applicant: Micron Technology, Inc., Boise, ID (US)

(72) Inventors: Kamal M. Karda, Boise, ID (US); Akira Goda, Boise, ID (US); Sanh D. Tang, Kuna, ID (US); Gurtej S. Sandhu, Boise, ID (US); Litao Yang, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 16/549,519

(22) Filed: Aug. 23, 2019

(65) Prior Publication Data

US 2021/0057424 A1    Feb. 25, 2021

(51) Int. Cl.
  *H01L 27/11524*    (2017.01)
  *H01L 27/1157*    (2017.01)
  (Continued)

(52) U.S. Cl.
  CPC .... *H01L 27/11524* (2013.01); *H01L 23/5226* (2013.01); *H01L 23/5283* (2013.01);
  (Continued)

(58) Field of Classification Search
  CPC ... H01L 23/52; H01L 23/522; H01L 23/5226; H01L 23/528; H01L 23/5283; H01L 27/115; H01L 27/11524; H01L 27/11529; H01L 27/11551; H01L 27/11556; H01L 27/11565; H01L 27/1157; H01L 27/11573; H01L 27/11575; H01L 27/11578; H01L 27/11582; H01L 29/12; H01L 29/24; H01L 29/4011; H01L 29/66; H01L 29/68; H01L 29/78621; H01L 29/78681; H01L 29/78696; H01L 29/792; H01L 45/12; H01L 45/122; H01L 45/14; H01L 45/141
  See application file for complete search history.

(56) References Cited

U.S. PATENT DOCUMENTS 9,679,650 B1    6/2017    Sakui
10,074,431 B2    9/2018    Sakui
(Continued)

FOREIGN PATENT DOCUMENTS

WO    2019/104896 A1    6/2019

*Primary Examiner* — Cheung Lee
(74) *Attorney, Agent, or Firm* — TraskBritt

(57) ABSTRACT

A transistor comprises a 2D material structure and a gate structure. The 2D material structure conformally extends on and between surfaces of dielectric fin structures extending in parallel in a first horizontal direction, and comprises a source region, a drain region, and a channel region positioned between the source region and the drain region in the first horizontal direction. The gate structure overlies the channel region of the 2D material structure and extends in a second horizontal direction orthogonal to the first horizontal direction. The gate structure is within horizontal boundaries of the channel region of the 2D material structure in the first horizontal direction. Microelectronic devices, memory devices, and electronic systems are also described.

21 Claims, 7 Drawing Sheets

(51) Int. Cl.
    *H01L 29/24*     (2006.01)
    *H01L 29/786*     (2006.01)
    *H01L 23/522*     (2006.01)
    *H01L 27/11556*     (2017.01)
    *H01L 27/11582*     (2017.01)
    *H01L 23/528*     (2006.01)

(52) U.S. Cl.
    CPC .... *H01L 27/1157* (2013.01); *H01L 27/11556* (2013.01); *H01L 27/11582* (2013.01); *H01L 29/24* (2013.01); *H01L 29/78621* (2013.01); *H01L 29/78681* (2013.01); *H01L 29/78696* (2013.01)

(56) References Cited

U.S. PATENT DOCUMENTS

| | | |
|---|---|---|
| 10,283,452 B2 | 5/2019 | Zhu et al. |
| 2012/0069680 A1 | 3/2012 | Goda et al. |
| 2019/0067475 A1 | 2/2019 | Liu et al. |
| 2019/0157280 A1 | 5/2019 | Wang et al. |
| 2019/0164972 A1* | 5/2019 | Peng .................. H01L 21/8258 |

* cited by examiner

TRANSISTORS INCLUDING TWO-DIMENSIONAL MATERIALS

TECHNICAL FIELD

The disclosure, in various embodiments, relates generally to the field of microelectronic device design and fabrication. More specifically, the disclosure relates to transistors including two-dimensional (2D) materials, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word line plates) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structures at edges (e.g., horizontal ends) of the tiers of conductive structures. The staircase structure includes individual "steps" defining contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. However, increasing the quantity of tiers of conductive structures (and, hence, the quantity of staircase structures and/or the quantity of steps in individual staircase structures) of a stack structure without undesirably increasing the overall width (e.g., lateral footprint) of the stack structure can result in complex and congested routing paths to electrically connect the conductive structures to additional components (e.g., string drivers) of the memory device. Such complex and congested routing paths may impede (or even prevent) desirable connection paths from and between other components of the memory device. In addition, as the quantity of tiers of conductive structures continues to increase, conventional locations for and configurations of the additional components of the memory device have become unable to support increased quantities of the additional components.

In view of the foregoing, there remains a need for new device (e.g., microelectronic device, memory device) configurations facilitating enhanced memory density while alleviating the problems (e.g., routing congestion, connection obstacles) of conventional device configurations, as well as for new electronic systems including the new device configurations.

DETAILED DESCRIPTION

Figure 1A:
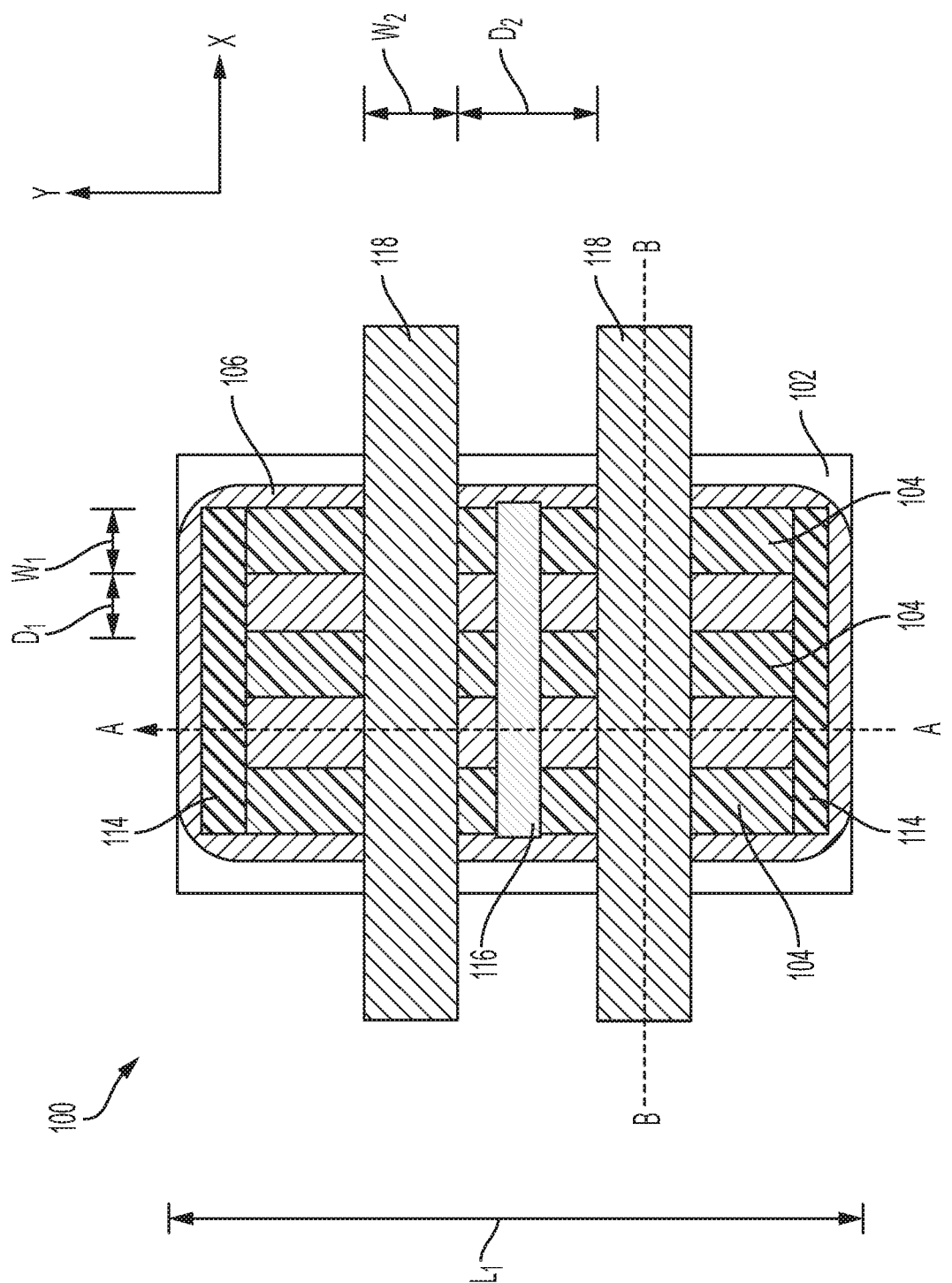
FIG. 1A is a simplified, partial top-down view of a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device. The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, "vertically neighboring" or "longitudinally neighboring" features (e.g., regions, structures, devices) means and includes features located most vertically proximate (e.g., vertically closest) one another. In addition, as used herein, "horizontally neighboring" or "horizontally neighboring" features (e.g., regions, structures, devices) means and includes features located most horizontally proximate (e.g., horizontally closest) one another.

As used herein, the term "pitch" refers to a distance between identical points in two neighboring features.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the terms "two-dimensional material" or "2D material" mean and include a crystalline material formed of and including a single (e.g., only one) monolayer, or multilayers (e.g., greater than or equal to two (2) layers), of units (e.g., atoms, molecules) bonded together through intramolecular forces (e.g., covalent bonds). Stated another way, a 2D material may be characterized as a crystalline material comprising about one or more monolayers bonded together though intramolecular forces.

As used herein, the term "NMOS" transistor means and includes a so-called metal-oxide transistor having a P-type channel region, an N-type channel region, or an I-type channel region. The gate of the NMOS transistor may comprise a conductive metal, another conductive material, such as polysilicon, or a combination thereof. As used herein, the term "PMOS" transistor means and includes a so-called metal-oxide transistor having an P-type channel region, an N-type channel region, or an I-type channel region. The gate of the PMOS transistor may comprise a conductive metal, another conductive material, such as polysilicon, or a combination thereof. Accordingly, the gate structures of such transistors may include conductive materials that are not necessarily metals.

Figure 1B:
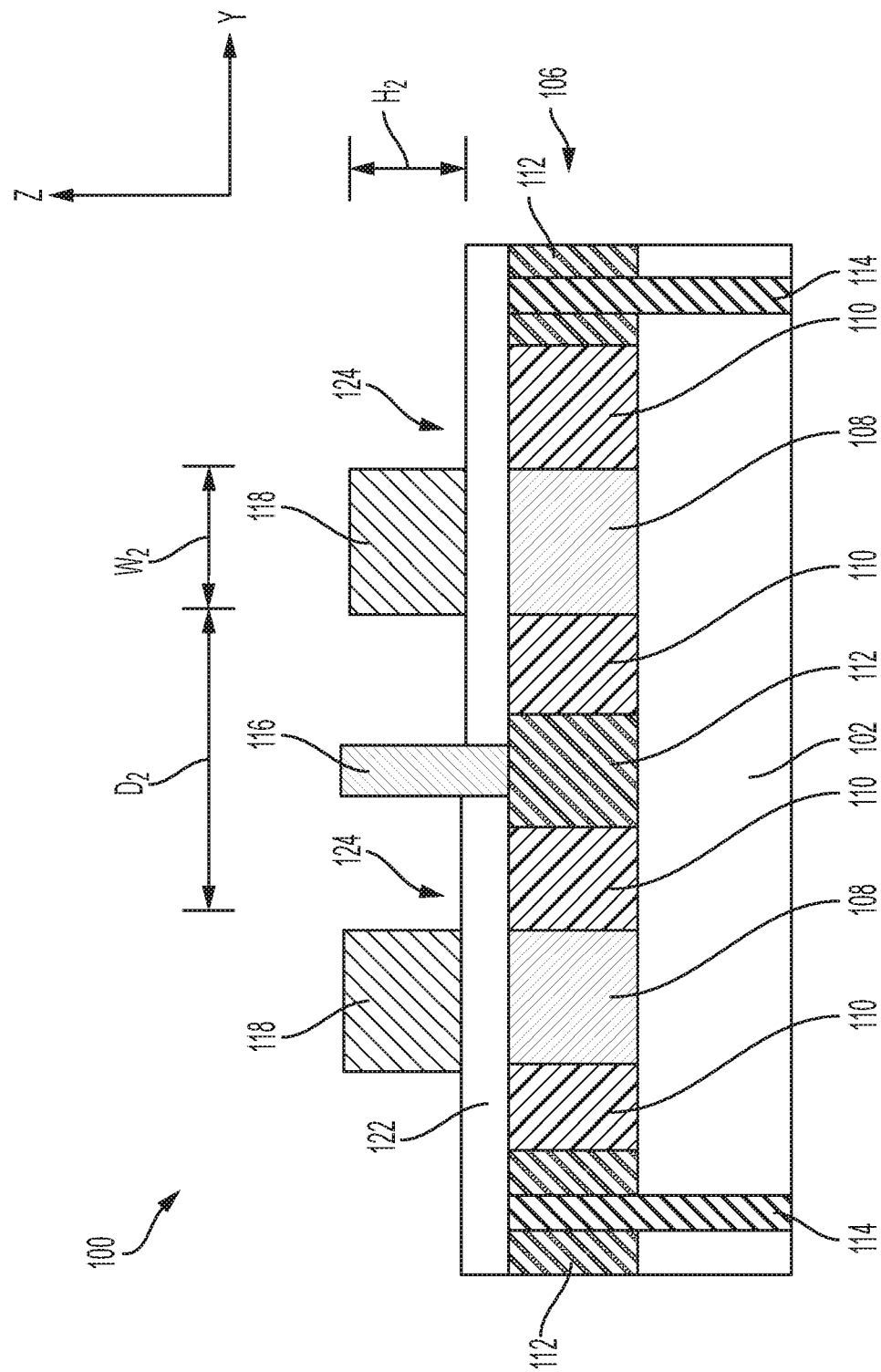
FIG. 1B is a simplified, partial cross-sectional view of the microelectronic device shown in FIG. 1A about the line A-A depicted in FIG. 2A.
Figure 1C:
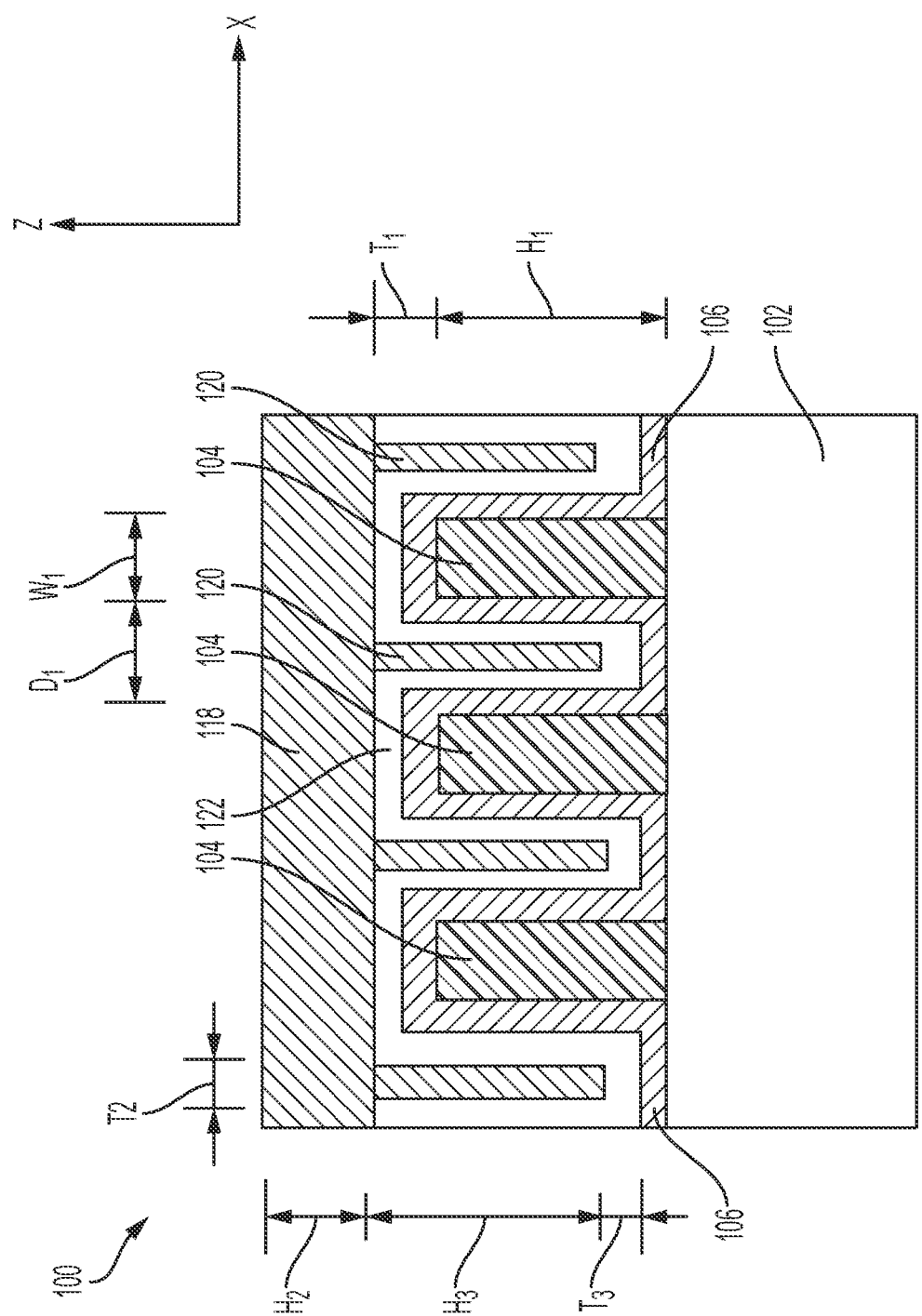
FIG. 1C is a simplified, partial cross-sectional view of the microelectronic device shown in FIG. 1A about the line B-B depicted in FIG. 2A.

FIG. 1A is a simplified, partial top-down view of a microelectronic device 100, in accordance with embodiments of the disclosure. FIG. 1B is a simplified, partial cross-sectional view of a portion of the microelectronic device 100 shown in FIG. 1A about the line A-A depicted in FIG. 1A. FIG. 1C is a simplified, partial cross-sectional view of a portion of the microelectronic device 100 shown in FIG. 1A about the line B-B depicted in FIG. 1A. For clarity and ease of understanding of the drawings and related description, not all components (e.g., features, structures, devices) of the microelectronic device 100 depicted in one of FIGS. 1A through 1C are depicted each other of FIGS. 1A through 1C. For example, some components of the microelectronic device 100 vertically overlying other components of the microelectronic device 100 are not shown in FIG. 1A so as to provide a clearer top-down view of the other components.

Referring to FIG. 1A, the microelectronic device 100 may include dielectric structures 104 overlying an isolation structure 102, a 2D material structure 106 extending over and between the dielectric structures 104, gate structures 118 overlying regions (e.g., channel regions) of the 2D material structure 106, and local contact structures 114 and global contact structures 116 coupled to additional regions (e.g., source regions, drain regions) of the 2D material structure 106. As described in further detail below, the microelectronic device 100 may include additional components (e.g., features, structures, regions, devices) beyond those depicted in FIG. 1A.

The isolation structure 102 (e.g., an interlayer dielectric (ILD) structure) may be formed of and include one or more dielectric materials, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the isolation structure 102 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. The isolation structure 102 include a substantially homogeneous distribution or a substantially heterogeneous distribution of the at least one dielectric material. As used herein, the term "homogeneous distribution" means relative amounts of a material do not vary throughout different portions (e.g., different horizontal portions, different vertical portions) of a structure. Conversely, as used herein, the term "heterogeneous distribution" means relative amounts of a material vary throughout different portions of a structure. In some embodiments, the isolation structure 102 exhibits a substantially homogeneous distribution of dielectric material. In further embodiments, the isolation structure 102 exhibits a substantially heterogeneous distribution of at least one dielectric material. The isolation structure 102 may, for example, be formed of and include a stack (e.g., laminate) of at least two different dielectric materials. In some embodiments, the isolation structure 102 is formed of and includes silicon dioxide ($SiO_2$).

The dielectric structures 104 may exhibit horizontally elongate shapes (e.g., fin shapes, lamellar shapes, oblong shapes) extending in parallel in a first horizontal direction (e.g., the Y-direction shown in FIG. 1A). As used herein, the term "parallel" means substantially parallel. In some embodiments, the dielectric structures 104 each exhibit substantially the same dimensions (e.g., substantially the same width $W_1$ in the X-direction (FIGS. 1A and 1C), substantially the same length $L_1$ in the Y-direction (FIG. 1A) orthogonal to the X-direction, and substantially the same height $H_1$ in the Z-direction (FIG. 1C)), shape, and spacing (e.g., substantially the same distance $D_1$ in the X-direction (FIGS. 1A and 1C)). In additional embodiments, at least one of the dielectric structures 104 exhibits one or more of at least one different dimension (e.g., a different length, a different width, a different height) and a different shape than one or more other of the dielectric structures 104, and/or a distance between at least one pair of horizontally neighboring dielectric structures 104 is different than a distance between at least one other pair of horizontally neighboring dielectric structures 104. The dimensions, shape, and spacing of the dielectric structures 104 may be selected to provide desirable dimensions and shape to the 2D material structure 106, as described in further detail below. By way of non-limiting example, the dielectric structures 104 may each individually exhibit an aspect ratio (e.g., ratio of height $H_1$ (FIG. 1C) to width $W_1$ (FIGS. 1A and 1C)) within a range of from about 2:1 to about 5:1 (e.g., from about 2:1 to about 3:1), and a ratio of the width $W_1$ of each dielectric structure 104 to the distance $D_1$ (e.g., spacing) between horizontally neighboring dielectric structures 104 may be within a range of from about 0.1:1 to about 10:1. In some embodiments, each of the dielectric structures 104 exhibits a width $W_1$ (FIGS. 1A and 1C) of about 100 nm, a height $H_1$ (FIG. 1C) within a range of from about 10 nm to about 500 nm, and a distance $D_1$ (FIGS. 1A and 1C) between horizontally neighboring dielectric structures 104 is within a range of from about 10 nm to about 100 nm.

The dielectric structures 104 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). Each of the dielectric structures 104 may individually include a substantially homogeneous distribution or a substantially heterogeneous distribution of the at least one dielectric material. In some embodiments, each of the dielectric structures 104 exhibits a substantially homogeneous distribution of dielectric material. In further embodiments, at least one of the dielectric structures 104 exhibits a substantially heterogeneous distribution of at least one dielectric material. One or more of the dielectric structures 104 may, for example, be formed of and include a stack (e.g., laminate) of at least two different dielectric materials. In some embodiments, each of the dielectric structures 104 is formed of and includes aluminum oxide ($Al_2O_3$). For example, each of the dielectric structures 104 may comprise crystalline $Al_2O_3$ having a hexagonal crystal structure or a rhombohedral crystal structure.

Referring collectively to FIGS. 1A and 1C, the 2D material structure 106 may be formed on or over surfaces (e.g., upper surfaces, side surfaces) of the isolation structure 102 and the dielectric structures 104. As shown in FIG. 1C, the 2D material structure 106 may at least partially (e.g., substantially) conform to a topography defined by the surfaces (e.g., upper surfaces, side surfaces) upon which the 2D material structure 106 is formed. The 2D material structure 106 may extend (e.g., continuously extend) over surfaces (e.g., upper surfaces, side surfaces) of isolation structure 102 and the dielectric structures 104. The 2D material structure 106 partially (e.g., less than completely) fills trenches (e.g., openings) horizontally intervening between (e.g., in the X-direction) between dielectric structures 104. The 2D material structure 106 may be formed to a desired thickness $T_1$, at least partially depending the horizontal distances (e.g., in the X-direction) between the horizontally neighboring dielectric structures 104. For example, the 2D material structure 106 may exhibit a thickness $T_1$ less than or equal to about 10 nanometers (nm), such as less than or equal to about 8 nm, less than or equal to about 6 nm, or less than or equal to about 4 nm. In some embodiments, the thickness $T_1$ of the 2D material structure 106 is within a range of from about 1 nm to about 4 nm.

The 2D material structure 106 may be formed of and include one or more of a transition metal di-chalcogenide (TMDC) having the general chemical formula $MX_2$, wherein M is a transition metal (e.g., molybdenum (Mo), tungsten (W), niobium (Nb), zirconium (Zr), hafnium (Hf), rhenium (Re), platinum (Pt), titanium (Ti), tantalum (Ta), vanadium (V), cobalt (Co) cadmium (Cd), chromium (Cr)) and X is a chalcogen (e.g., sulfur (S), selenium (Se), tellurium (Te)); a carbide or carbonitride having the general chemical formula $M_{n+1}X_n$ (also referred to as an "MXene") and including oxygen (—O), hydroxyl (—OH), or fluoro (—F) surface termination, wherein M is a transition metal from Groups IV or V of the Periodic Table of Elements (e.g., Ti, Hf, Zr, V, Nb, Ta) and X is selected from carbon (C) and nitrogen (N); graphene; graphene-oxide; stanine; phosphorene; hexagonal boron nitride (h-BN); borophene; silicene; graphyne; germanene; germanane; a 2D supracrystal; and a monolayer of a semiconductive material. In some embodiments, the 2D material structure 106 comprises one or more TMDC monolayer(s), such as one or more monolayer(s) of one or more of tungsten sulfide ($WS_2$), tungsten selenide ($WSe_2$), tungsten telluride ($WTe_2$), molybdenum sulfide ($MoS_2$), molybdenum selenide ($MoSe_2$), molybdenum telluride ($MoTe_2$), niobium sulfide ($NbS_2$), niobium selenide ($NbSe_2$), niobium telluride ($NbTe_2$), zirconium sulfide ($ZrS_2$), zirconium selenide ($ZrSe_2$), zirconium telluride ($ZrTe_2$), hafnium sulfide ($HfS_2$), hafnium selenide ($HfSe_2$), hafnium telluride ($ZrTe_2$), rhenium sulfide ($ReS_2$), rhenium selenide ($ReSe_2$), and rhenium telluride ($ReTe_2$). In some embodiments, the 2D material structure 106 has electron mobility within a range of from about 10 centimeters squared per volt-second ($cm^2/V \cdot s$) to about 400 $cm^2/V \cdot s$ (e.g., within a range from about 150 $cm^2/V \cdot s$ to about 400 $cm^2/V \cdot s$, such as from about 150 $cm^2/V \cdot s$ to about 200 $cm^2/V \cdot s$), and a bandgap within a range of from about 1.2 electronvolts (eV) to about 2.5 eV (e.g., within a range of from about 1.8 eV to about 2.5 eV). By way of non-limiting example, the 2D material structure 106 may comprise one or more of $WS_2$, $WSe_2$, $MoS_2$, and $MoSe_2$. In some embodiments, the 2D material structure 106 is $WSe_2$. In addition embodiments, the 2D material structure 106 is $WS_2$. In further embodiments, the 2D material structure 106 is $MoSe_2$.

Referring to FIG. 1B, the 2D material structure 106 may be formed to include channel regions 108, first conductively doped regions 110, and second conductively doped regions 112. Each of the channel regions 108 of the 2D material structure 106 may individually be horizontally interposed (e.g., in the Y-direction) between a pair (e.g., two (2)) of the first conductively doped regions 110, and each pair of the first conductively doped regions 110 may individually be horizontally interposed (e.g., in the Y-direction) between a pair (e.g., two (2)) of the second conductively doped regions 112. As described in further detail below, the first conductively doped regions 110 may serve as offset regions (e.g., lateral double-diffused (LDD) offset regions) to horizontally offset the first conductively doped regions 110 from the gate structures 118, and the second conductively doped regions 112 may serve as source regions and drain regions for transistors (e.g., driver transistors, such as string driver transistors) including the gate structures 118, the channel regions 108, the first conductively doped regions 110, and the second conductively doped regions 112. By way of non-limiting example, as shown in FIG. 1B, the second conductively doped regions 112 may include source regions 112A and drain regions 112B. Each source region 112A may be horizontally separated from the drain region 112B most horizontally proximate thereto (e.g., in the Y-direction) by two (2) of the first conductively doped regions 110 and one of the channel regions 108 between the two (2) of the first conductively doped regions 110. A single (e.g., only one) source region 112A may be shared by two (2) horizontally neighboring transistors of the microelectronic device 100.

The first conductively doped regions 110 and the second conductively doped regions 112 (e.g., the source regions 112A, the drain regions 112B) of the 2D material structure 106 may be doped with any desired dopant(s). In some embodiments, the first conductively doped regions 110 and the second conductively doped regions 112 are doped with at least one N-type dopant (e.g., one or more of phosphorus, arsenic, antimony, and bismuth), and the first conductively doped regions 110 are doped to exhibit relatively less free electrons than the second conductively doped regions 112. For example, the first conductively doped regions 110 may comprise $N^-$ regions, and the second conductively doped regions 112 may comprise $N^+$ regions. In some such embodiments, the channel regions 108 are doped with at least one P-type dopant (e.g., one or more of boron, aluminum, and gallium). In additional embodiments, the first conductively doped regions 110 and the second conductively doped regions 112 are doped with at least one P-type dopant (e.g., one or more of boron, aluminum, and gallium), and the first conductively doped regions 110 are doped to exhibit relatively less deficiencies of valence electrons (commonly referred to as "holes") than the second conductively doped regions 112. For example, the first conductively doped regions 110 may comprise $P^-$ regions, and the second conductively doped regions 112 may comprise $P^+$ regions. In some such embodiments, the channel regions 108 are doped with at least one N-type dopant (e.g., one or more of phosphorus, arsenic, antimony, and bismuth). In further embodiments, one or more of the first conductively doped regions 110 and the second conductively doped regions 112 of the 2D material structure 106 are substantially undoped. For example, the properties (e.g., 2D material composition) of the 2D material structure 106 may permit one or more of first conductively doped regions 110 and the second conductively doped regions 112 to comprise I-type regions.

With continued reference to FIG. 1B, the local contact structures 114 and the global contact structures 116 may contact (e.g., electrically contact, physically contact) the second conductively doped regions 112 of the 2D material structure 106. For example, the local contact structures 114 may physically contact the drain regions 112B of the 2D material structure 106, and the global contact structures 116 may physically contact the source regions 112A of the 2D material structure 106. The local contact structures 114 may be formed to downwardly vertically extend (e.g., in the negative Z-direction) from the drain regions 112B of the 2D material structure 106 and through the isolation structure 102 under the 2D material structure 106; and the global contact structures 116 may be formed to upwardly vertically extend (e.g., in the positive Z-direction) from the source regions 112A of the 2D material structure 106. As shown in FIG. 1B, in some embodiments, the local contact structures 114 are formed to downwardly vertically extend from upper boundaries of the drain regions 112B of the 2D material structure 106, such that the local contact structures 114 vertically extend through the drain regions 112B of the 2D material structure 106; and the global contact structures 116 are formed to upwardly vertically extend from upper boundaries of the source regions 112A of the 2D material structure 106. In additional embodiments, the local contact structures 114 are formed to downwardly vertically extend from lower boundaries of the drain regions 112B of the 2D material structure 106, such that the local contact structures 114 do not vertically extend through the drain regions 112B of the 2D material structure 106; and/or the global contact structures 116 are formed to upwardly vertically extend from lower boundaries of the source regions 112A of the 2D material structure 106, such that the global contact structures 116 vertically extend through the source regions 112A of the 2D material structure 106. As described in further detail below, the local contact structures 114 may electrically connect the 2D material structure 106 of the microelectronic device 100 to additional structures (e.g., additional conductive structures, such as conductive line structures and/or additional conductive contact structures) and/or devices vertically underlying the microelectronic device 100; and the global contact structures 116 may electrically connect the 2D material structure 106 of the microelectronic device 100 to additional structures and/or devices vertically overlying the microelectronic device 100. In additional embodiments, the local contact structures 114 and/or the global contact structures 116 physically contact the first conductively doped regions 110 of the 2D material structure 106 instead of the second conductively doped regions 112. In further embodiments, the local contact structures 114 and/or the global contact structures 116 physically contact the first conductively doped regions 110 of the 2D material structure 106 in addition to the second conductively doped regions 112.

The local contact structures 114 and the global contact structures 116 may be each individually formed of and include at least one electrically conductive material, such as one or more of at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)); at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel); at least one conductively doped semiconductor material (e.g., conductively doped polysilicon, conductively doped germanium (Ge), conductively doped silicon germanium (SiGe)); and at least one conductive metal-containing material (e.g., a conductive metal nitride, a conductive metal silicide, a conductive metal carbide, a conductive metal oxide). The local contact structures 114 and the global contact structures 116 may include substantially homogeneous distributions of the electrically conductive material, or may include substantially heterogeneous distributions of the electrically conductive material. If one or more of the local contact structures 114 and the global contact structures 116 exhibit a substantially heterogeneous distribution of electrically conductive material, amounts of the electrically conductive material may vary stepwise (e.g., change abruptly), or may vary continuously (e.g., change progressively, such as linearly, parabolically) throughout different portions of the one or more of the local contact structures 114 and the global contact structures 116. In some embodiments, the local contact structures 114 and the global contact structures 116 each individually exhibit a substantially homogeneous distribution of electrically conductive material. In additional embodiments, one or more of at least one of the local contact structures 114 and at least one of the global contact structures 116 exhibits a substantially heterogeneous distribution of at least one electrically conductive material. One or more of at least one of the local contact structures 114 and at least one of the global contact structures 116 may, for example, be formed of and include a stack of at least two different electrically conductive materials.

Referring collectively to FIGS. 1A and 1B, the gate structures 118 may vertically overlie (e.g., in the Z-direction) the channel regions 108 (FIG. 1B) of the 2D material structure 106, and may exhibit horizontally elongate shapes (e.g., oblong shapes, rectangular shapes) extending in parallel in a second horizontal direction (e.g., the X-direction (FIG. 1A)) orthogonal to the first horizontal direction (e.g., the Y-direction) in which the dielectric structures 104 (FIG. 1A) extend. The gate structures 118 may be substantially horizontally aligned (e.g., in the Y-direction) with the channel regions 108 of the 2D material structure 106. Each of the gate structures 118 may individually horizontally intervene (e.g., in the Y-direction) between one of the source regions 112A of the 2D material structure 106 and one of the drain regions 112B of the 2D material structure 106 most horizontally proximate (e.g., in the Y-direction) to the one of the source regions 112A. The gate structures 118 may each exhibit substantially the same dimensions (e.g., width $W_2$ in the Y-direction (FIGS. 1A and 1B), length in the X-direction (FIG. 1A), and height $H_2$ in the Z-direction (FIGS. 1B and 1C)) and shape as one another. In some embodiments, each of the gate structures 118 exhibits a width $W_2$ of about 18.5 micrometers (μm), and a distance $D_2$ (FIGS. 1A and 1B) between some horizontally neighboring gate structures is about 30.5 μm.

The gate structures 118 may be formed of and include at least one electrically conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide). The gate structures 118 may include substantially homogeneous distributions of the electrically conductive material, or may include substantially heterogeneous distributions of the electrically conductive material. If the gate structures 118 exhibit substantially heterogeneous distributions of the electrically conductive material, amounts of the electrically conductive material may vary stepwise (e.g., change abruptly), or may vary continuously (e.g., change progressively, such as linearly, parabolically) throughout different portions of the gate structures 118. In some embodiments, the gate structures 118 each exhibit a substantially homogeneous distribution of electrically conductive material. In additional embodiments, one or more (e.g., each) the gate structures 118 exhibits a substantially heterogeneous distribution of at least one electrically conductive material. One or more of the gate structures 118 may, for example, be formed of and include a stack of at least two different electrically conductive materials.

Referring to FIG. 1C, the microelectronic device 100 may further include conductive structures 120 vertically extending (e.g., in the Z-direction) from the gate structures 118 toward the channel regions 108 of the 2D material structure 106. The conductive structures 120 may effectively serve as protrusions or extensions of the gate structures 118 to accommodate the non-planar structure of the 2D material structure 106 effectuated by the combined topography of the dielectric structures 104 and the isolation structure 102. The conductive structures 120 may horizontally intervene (e.g., in the X-direction) between horizontally neighboring dielectric structures 104. The conductive structures 120 partially (e.g., less than completely) fills portions of the trenches (e.g., openings) horizontally intervening between (e.g., in the X-direction) between the dielectric structures 104 (e.g., portions of the trenches not occupied by the 2D material structure 106). The conductive structures 120 may be formed to any desired dimensions, at least partially depending the dimensions (e.g., width in the Y-direction (FIG. 1A) of the gate structures 118), the dimensions (e.g., width in the X-direction (FIG. 1C), height in the Z-direction (FIG. 1C)) and the spacing (e.g., in the X-direction (FIG. 1C)) of the dielectric structures 104, and the dimensions (e.g., thickness) of the 2D material structure 106. The conductive structures 120 may each individually exhibit a width in the Y-direction (FIG. 1A) substantially equal to a width of the gate structures 118 in the Y-direction (FIG. 1A), and may exhibit a height $H_3$ in the Z-direction (FIG. 1C) and a thickness $T_2$ in the X-direction (FIG. 1C) permitting the conductive structure 120 to be substantially equally offset (e.g., spaced apart) from all portions of the 2D material structure 106 proximate thereto in the X-direction and the Z-direction.

The conductive structures 120 may be formed of and include at least one electrically conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide). The conductive structures 120 may include substantially homogeneous distributions of the electrically conductive material, or may include substantially heterogeneous distributions of the electrically conductive material. If the conductive structures 120 exhibit substantially heterogeneous distributions of the electrically conductive material, amounts of the electrically conductive material may vary stepwise (e.g., change abruptly), or may vary continuously (e.g., change progressively, such as linearly, parabolically) throughout different portions of the conductive structures 120. In some embodiments, the conductive structures 120 each exhibit a substantially homogeneous distribution of electrically conductive material. In additional embodiments, one or more (e.g., each) the conductive structures 120 exhibits a substantially heterogeneous distribution of at least one electrically conductive material. One or more of the conductive structures 120 may, for example, be formed of and include a stack of at least two different electrically conductive materials. A material composition of the conductive structures 120 may be substantially the same as a material composition of the gate structures 118, or the material composition of the conductive structures 120 may be different than the material composition of the gate structures 118. In some embodiments, the material composition of the conductive structures 120 is substantially the same as the material composition of the gate structures 118.

With continued reference to FIG. 1C, the microelectronic device 100 may further include a gate dielectric material 122 positioned between (e.g., horizontally between, vertically between) the 2D material structure 106 and the gate structures 118 and the conductive structures 120. The gate dielectric material 122 may extend from boundaries (e.g., horizontal boundaries, vertical boundaries) of the 2D material structure 106 to opposing boundaries (e.g., horizontal boundaries, vertical boundaries) of the gate structures 118 and the conductive structures 120. The gate dielectric material 122 may fill remaining portions of the trenches (e.g., openings) horizontally intervening between (e.g., in the X-direction) between the dielectric structures 104 (e.g., portions of the trenches not occupied by the 2D material structure 106 and the conductive structures 120). The gate dielectric material 122 may be formed to a desired thickness $T_3$, at least partially depending the dimensions (e.g., width $W_2$ (FIG. 1A)) of the gate structures 118; the dimensions (e.g., width $W_2$ (FIG. 1A), height $H_3$ (FIG. 1C)) of the conductive structures 120; the dimensions (e.g., width $W_1$ (FIG. 1C), height $H_2$ (FIG. 1C)) and the spacing (e.g., distance $D_1$ (FIG. 1C)) of the dielectric structures 104; the dimensions (e.g., thickness $T_1$ (FIG. 1C)) of the 2D material structure 106; and a distance (e.g., in the Z-direction (FIG. 1C)) between upper surfaces of the dielectric structures 104 and lower surfaces of the gate structures 118. By way of non-limiting example, the gate dielectric material 122 may be formed to exhibit a thickness $T_3$ less than or equal to about 15 nm, such less than or equal to about 10 nm, less than or equal to about 8 nm, or less than or equal to about 5 nm. In some embodiments, the gate dielectric material 122 exhibits a thickness $T_3$ within a range of from about 5 nm to about 10 nm.

The gate dielectric material 122 may be formed of and include at least one dielectric material, such as one or more of at least one oxide dielectric material (e.g., one or more of $SiO_x$, $AlO_x$, phosphosilicate glass, borosilicate glass, borophosphosilicate glass, fluorosilicate glass), at least one nitride dielectric material (e.g., $SiN_y$), and at least one low-K dielectric material (e.g., one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_zN_y$)). The gate dielectric material 122 may include a substantially homogeneous distribution or a substantially heterogeneous distribution of the at least one dielectric material. In some embodiments, the gate dielectric material 122 exhibits a substantially homogeneous distribution of dielectric material. In further embodiments, the gate dielectric material 122 exhibits a substantially heterogeneous distribution of at least one dielectric material. In some embodiments, the gate dielectric material 122 is formed of and includes $SiO_2$.

Referring to FIG. 1B, the gate structures 118, the gate dielectric material 122, and the channel regions 108 and first conductively doped regions 110 (including the source regions 112A and the drain regions 112B) and channel regions 108 of the 2D material structure 106 may form transistors 124 (e.g., driver transistors, such as string driver transistors) of the microelectronic device 100. Each of the transistors 124 may include one of the gate structures 118, the gate dielectric material 122, one of the channel regions 108 of the 2D material structure 106, one of the drain regions 112B of the 2D material structure 106, and one of the source regions 112A of the 2D material structure 106. Each of the transistors 124 also include the conductive structures 120 (FIG. 1C) vertically extending from the gate structure 118 thereof. In some embodiments, the transistors 124 comprise high voltage (HV) transistors (e.g., HVNMOS transistors, HVPMOS transistors). HV transistors are operative at higher voltages than non-HV transistors (e.g., NMOS transistors, PMOS transistors). For example, HV transistors may have threshold voltages greater than the threshold voltage range (e.g., from about +0.5V to about +0.7V) of non-HV transistors, such as a threshold voltages greater than or equal to about +3V higher than the threshold voltage range of non-HV transistors. For example, if the first conductively doped regions 110 of the 2D material structure 106 are doped with at least one N-type dopant, the transistors 124 comprise HVNMOS transistors. As another example, if the first conductively doped regions 110 of the 2D material structure 106 are doped with at least one P-type dopant, the transistors 124 comprise HVPMOS transistors.

The non-planar topography of the 2D material structure 106 (e.g., as defined by the surfaces of the isolation structure 102 and the dielectric structures 104 (FIGS. 1A and 1C) upon which the 2D material structure 106 is formed) provides the transistors 124 with a so-called "folded channel" configuration. The folded channel configuration of the transistors 124 may provide the transistors 124 with greater effective channel width as compared to conventional transistors not exhibiting the folded channel configuration of the disclosure (e.g., conventional transistors exhibiting substantially planar channel configurations). In addition, the material composition of the 2D material structure 106 may provide the channel regions 108 of the transistors 124 with higher bandgap and comparable (or greater) electron mobility than conventional transistors employing semiconductive materials such as silicon and polysilicon for the channel regions thereof. Accordingly, the 2D material structure 106 may facilitate more favorable electrical properties in the transistors 124 (e.g., one or more of relatively higher on current ($I_{on}$), relatively lower off current ($I_{off}$), relatively faster switching speed, improved breaking voltage (BV), relatively lower operating voltage, relatively reduced current leakage, relatively less scattering at an interface between the channel region 108 and the gate dielectric material 122) of the disclosure as compared to conventional transistors. In addition, the 2D material structure 106 may be formed at relatively lower temperatures (e.g., temperatures less than or equal to about 600° C., such as temperatures within a range of from about 400° C. to about 600° C., or less than or equal to about 400° C.) to reduce or eliminate temperature incompatibilities with other structures and/or devices underlying of the microelectronic device 100.

Thus, in accordance with embodiments of the disclosure, a transistor comprises a 2D material structure and a gate structure. The 2D material structure conformally extends on and between surfaces of dielectric fin structures extending in parallel in a first horizontal direction, and comprises a source region, a drain region, and a channel region positioned between the source region and the drain region in the first horizontal direction. The gate structure overlies the channel region of the 2D material structure and extends in a second horizontal direction orthogonal to the first horizontal direction. The gate structure is within horizontal boundaries of the channel region of the 2D material structure in the first horizontal direction.

Moreover, in accordance with additional embodiments of the disclosure, a microelectronic device comprises discrete dielectric structures, a non-planar 2D material structure, gate structures, conductive structures, contact structures, and at least one additional contact structure. The discrete dielectric structures overlie an isolation structure and are separated from one another by filled trenches. The non-planar 2D material structure extends over surfaces of the isolation structure and the discrete dielectric structures inside and outside of the filled trenches, and comprises conductively doped regions and channel regions between the conductively doped regions. The gate structures overlie and are substantially aligned with the channel regions of the non-planar 2D material structure. The conductive structures extend from the gate structures and into the trenches. The contact structures are coupled to some of the conductively doped regions and extend into the isolation structure. The at least one additional contact structure is coupled to at least one other of the conductively doped regions and extends away from the isolation structure.

In additional embodiments, the 2D material structure 106 may be formed to be substantially planar (e.g., substantially horizontally planar), such that transistors including the 2D material structure 106 exhibit a substantially planar (e.g., non-folded) channel configuration. In such embodiments, the dielectric structures 104 (FIGS. 1A and 1C) may be omitted (e.g., absent), such that the 2D material structure 106 substantially continuously horizontally extends over a substantially planar upper surface of the isolation structure 102 (thereby forming the 2D material structure 106 to also be substantially planar); and the conductive structures 120 (FIG. 1C) vertically extending from the gate structures 118 may also be omitted. While such a planar configuration of the channel regions of the transistors may exhibit less effective channel width than the channel regions 108 of the transistors 124, the material composition of the 2D material structure 106 may still impart the transistors with improved electrical properties as compared to conventional transistors employing semiconductive materials such as silicon and polysilicon for the channel regions thereof.

While FIGS. 1A through 1C depict the microelectronic device 100 as including a single (e.g., only one) 2D material structure 106 and two (2) transistors 124 (FIG. 1B) including portions of the 2D material structure 106; the microelectronic device 100 may include additional 2D material structures 106 and additional transistors 124 including portions of the additional 2D material structures 106. For example, the microelectronic device 100 may include multiple (e.g., more than one) 2D material structures 106 substantially similar to one another, and spaced apart from one another on the isolation structure 102. Each of the multiple 2D material structures 106 may individually form portions (e.g., channel regions 108, source regions 112A, drain regions 112B) of transistors 124 of the microelectronic device 100, as well as source regions 112A (FIG. 1B) and drain regions 112B (FIG. 1B) for the transistors 124 of the microelectronic device 100. In addition, the microelectronic device 100 may include additional local contact structures 114 and additional global contact structures 116 operatively associated with the additional 2D material structures 106 and the additional transistors 124 in substantially the same manner previously describe with reference to FIGS. 1A through 1C. The quantities, configurations, and arrangements of additional 2D material structures 106, additional transistors 124, additional local contact structures 114, and additional global contact structures 116 of the microelectronic device 100 may dependent on the quantities, configurations, and arrangements of additional structures and/or devices operatively associated with the microelectronic device 100, as described in further detail below.

Figure 2A:
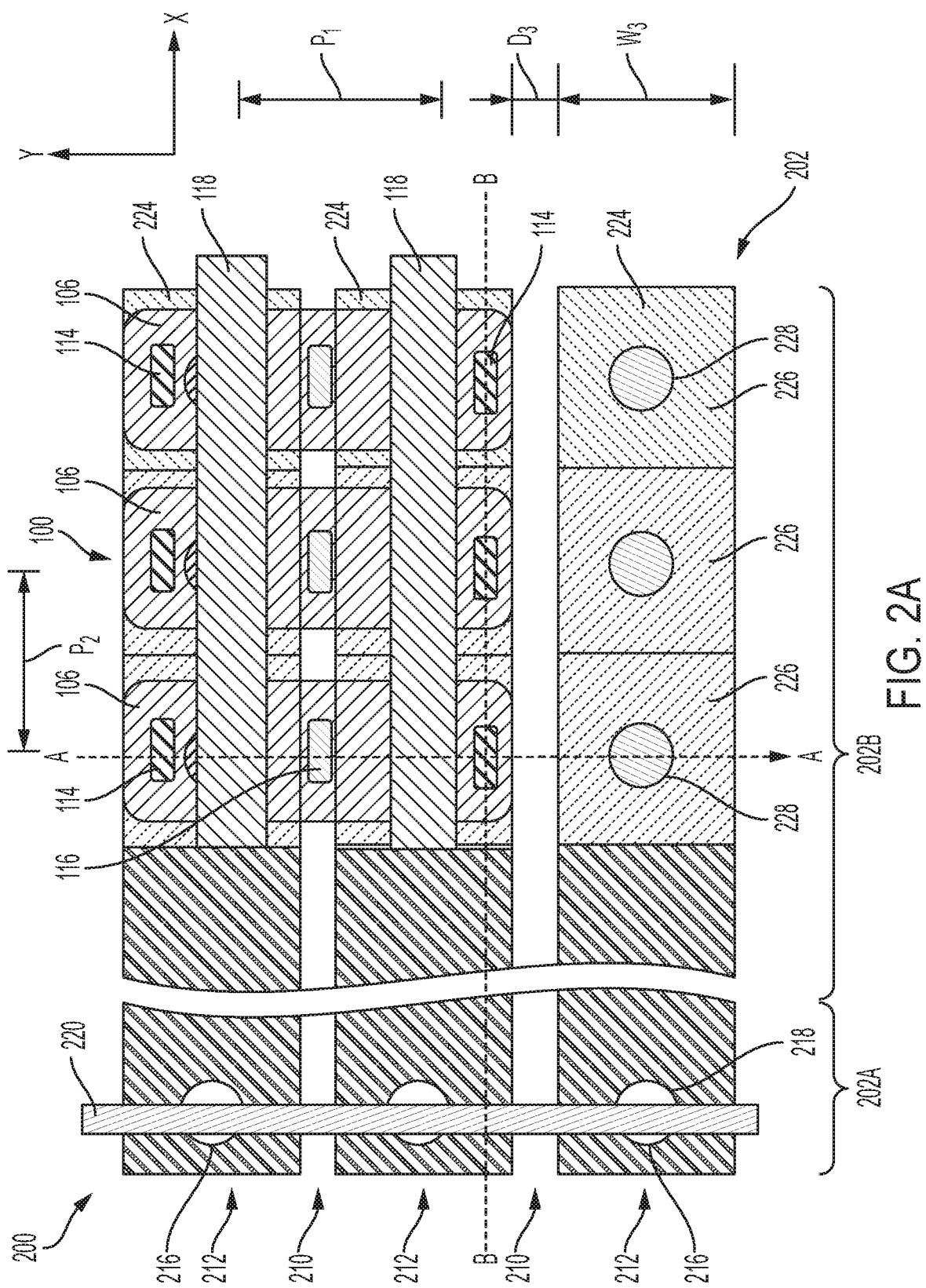
FIG. 2A is a simplified, partial top-down view of a memory device including the microelectronic device shown in FIGS. 1A through 1C, in accordance with embodiments of the disclosure.
Figure 2B:
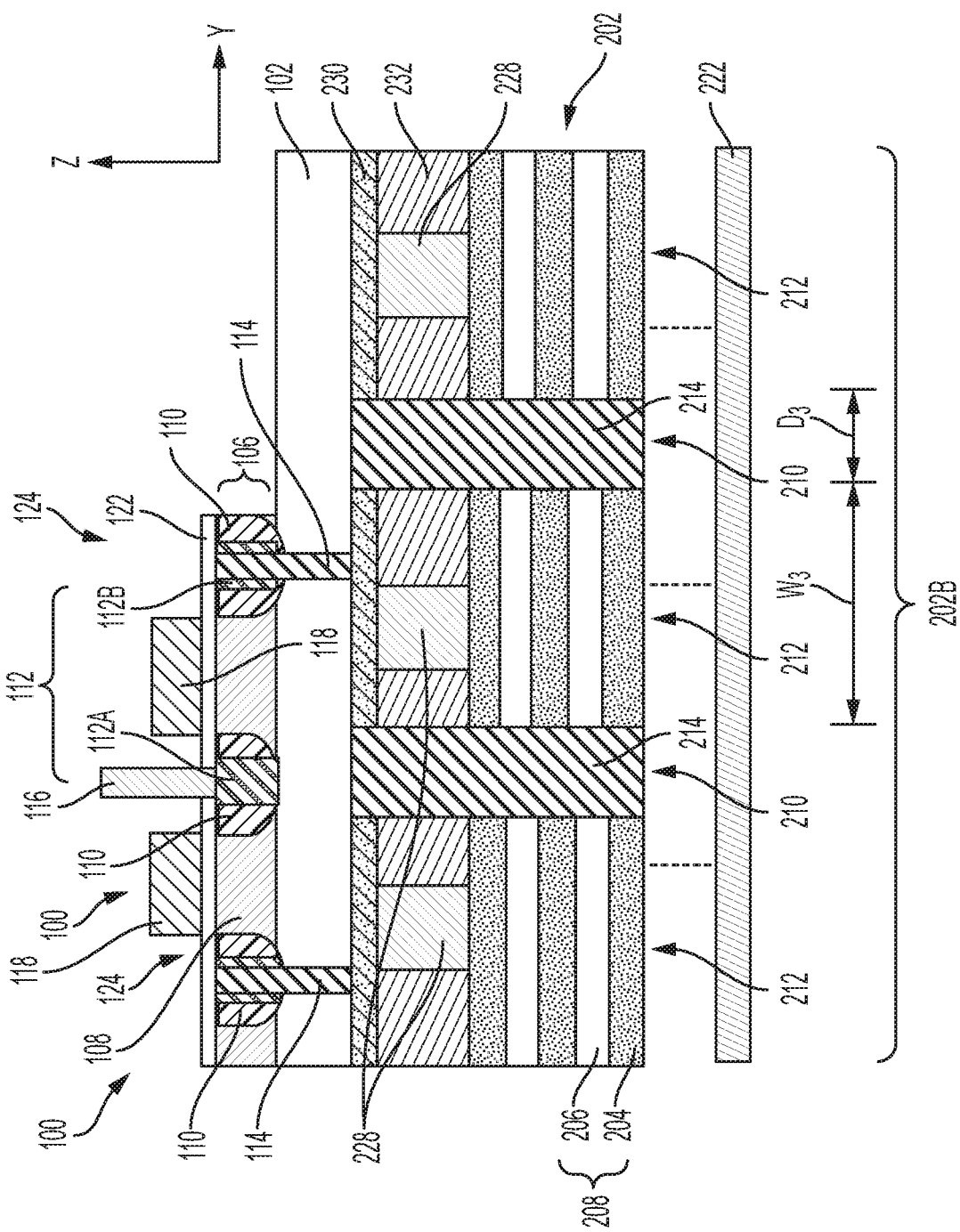
FIG. 2B is a simplified, partial cross-sectional view of the memory device shown in FIG. 2A about the line A-A depicted in FIG. 2A.
Figure 2C:
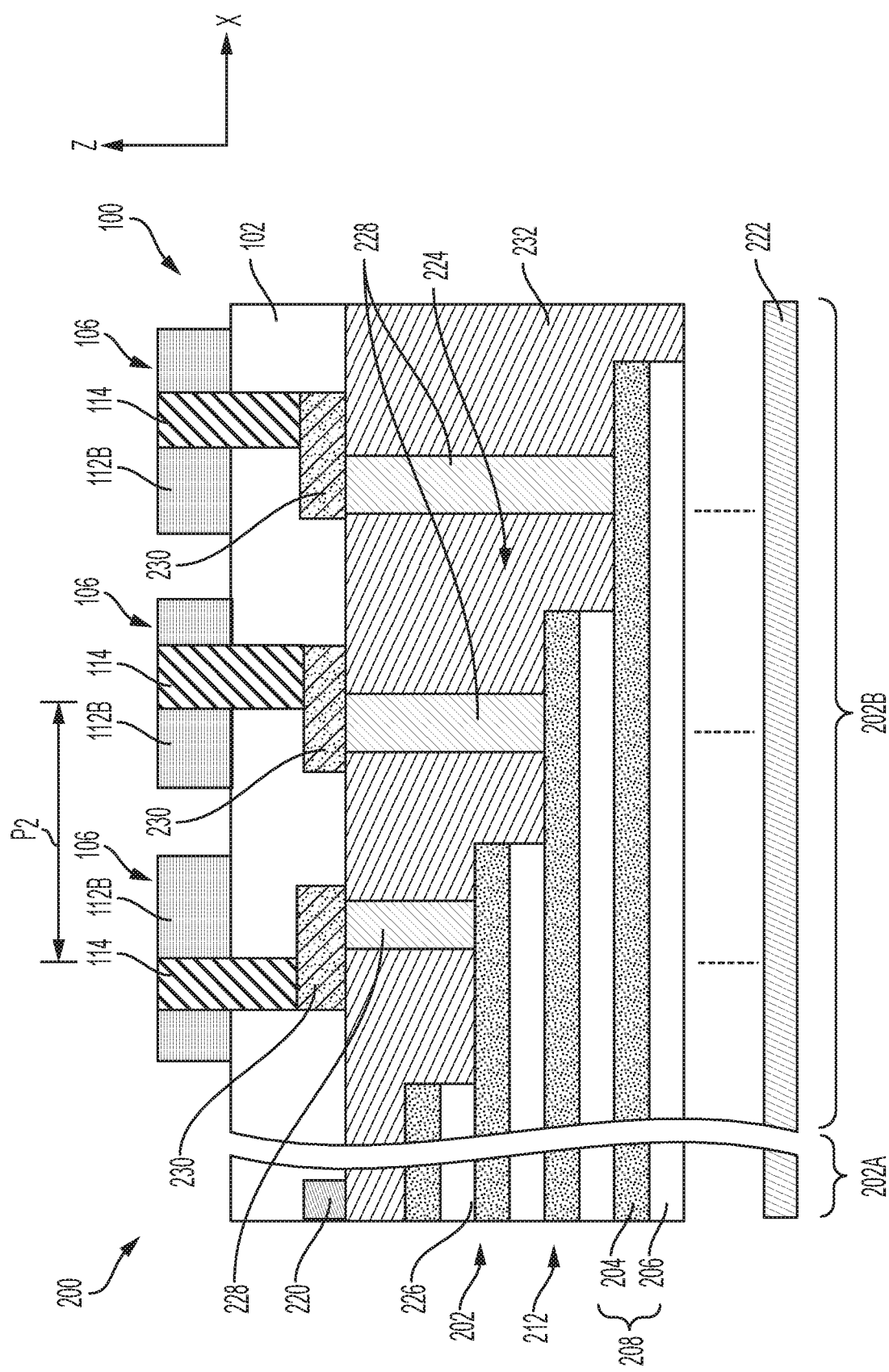
FIG. 2C is a simplified, partial cross-sectional view of the memory device shown in FIG. 2A about the line B-B depicted in FIG. 2A.

Microelectronic devices (e.g., the microelectronic device 100 previously described with reference to FIGS. 1A through 1C) in accordance with embodiments of the disclosure may be used in embodiments of memory devices of the disclosure. For example, FIG. 2A is a simplified, partial top-down view of a memory device 200 (e.g., 3D NAND Flash memory device) including one or more embodiments of the microelectronic device 100 previously described with reference to FIGS. 1A through 1C. FIG. 2B is a simplified, partial cross-sectional view of a portion of the memory device 200 shown in FIG. 2A about the line A-A depicted in FIG. 2A. FIG. 2C is a simplified, partial cross-sectional view of a portion of the memory device 200 shown in FIG. 2A about the line B-B depicted in FIG. 2A. For clarity and ease of understanding of the drawings and related description, not all components (e.g., features, structures, devices) of the memory device 200 depicted in one of FIGS. 2A through 2C are depicted each other of FIGS. 2A through 2C. For example, some components of the memory device 200 vertically overlying other components of the memory device 200 are not shown in FIG. 2A so as to provide a clearer top-down view of the other components.

As shown in FIGS. 2B and 2C, the microelectronic device 100 (including the components thereof previously described with reference to FIGS. 1A through 1C) of the memory device 200 may vertically overlie (e.g., in the Z-direction) and be operatively associated with a stack structure 202 of the memory device 200. The stack structure 202 includes a vertically alternating (e.g., in the Z-direction) sequence of conductive structures 204 (e.g., access line plates, word line plates) and insulating structures 206 arranged in tiers 208. In addition, as shown in FIGS. 2A and 2C, the stack structure 202 includes a memory array region 202A, and a staircase region 202B horizontally neighboring (e.g., in the X-direction) a first horizontal boundary of the memory array region 202A. As described in further detail below, the memory device 200 further includes additional components (e.g., features, structures, devices) within horizontal boundaries of the different regions (e.g., the memory array region 202A and the staircase region 202B) of the stack structure 202.

Referring collectively to FIGS. 2B and 2C, the tiers 208 of the stack structure 202 of the memory device 200 may each individually include at least one of the conductive structures 204 vertically neighboring at least one of the insulating structures 206. The stack structure 202 may include a desired quantity of the tiers 208. For example, the stack structure 202 may include greater than or equal to ten (10) of the tiers 208, greater than or equal to twenty-five (25) of the tiers 208, greater than or equal to fifty (50) of the tiers 208, greater than or equal to one hundred (100) of the tiers 208, greater than or equal to one hundred and fifty (150) of the tiers 208, or greater than or equal to two hundred (200) of the tiers 208 of the conductive structures 204 and the insulating structures 206.

The conductive structures 204 of the tiers 208 of the stack structure 202 may be formed of and include at least one electrically conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide). In some embodiments, the conductive structures 204 are formed of and include a metallic material (e.g., a metal, such as W; an alloy). In additional embodiments, the conductive structures 204 are formed of and include conductively doped polysilicon. Each of the conductive structures 204 may individually include a substantially homogeneous distribution of the at least one electrically conductive material, or a substantially heterogeneous distribution of the at least one electrically conductive material. In some embodiments, each of the conductive structures 204 of each of the tiers 208 of the stack structure 202 exhibits a substantially homogeneous distribution of electrically conductive material. In additional embodiments, at least one of the conductive structures 204 of at least one of the tiers 208 of the stack structure 202 exhibits a substantially heterogeneous distribution of at least one electrically conductive material. The conductive structure 204 may, for example, be formed of and include a stack of at least two different electrically conductive materials. The conductive structures 204 of each of the tiers 208 of the stack structure 202 may each be substantially planar, and may each exhibit a desired thickness.

The insulating structures 206 of the tiers 208 of the stack structure 202 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulating structures 206 are formed of and include $SiO_2$. Each of the insulating structures 206 may individually include a substantially homogeneous distribution of the at least one insulating material, or a substantially heterogeneous distribution of the at least one insulating material. In some embodiments, each of the insulating structures 206 of each of the tiers 208 of the stack structure 202 exhibits a substantially homogeneous distribution of insulating material. In additional embodiments, at least one of the insulating structures 206 of at least one of the tiers 208 of the stack structure 202 exhibits a substantially heterogeneous distribution of at least one insulating material. The insulating structure 206 may, for example, be formed of and include a stack (e.g., laminate) of at least two different insulating materials. The insulating structures 206 of each of the tiers 208 of the stack structure 202 may each be substantially planar, and may each individually exhibit a desired thickness.

At least one lower conductive structure 204 of the stack structure 202 may be employed as at least one lower select gate (e.g., at least one source side select gate (SGS)) of the memory device 200. In some embodiments, a single (e.g., only one) conductive structure 204 of a vertically lowermost tier 208 of the stack structure 202 is employed as a lower select gate (e.g., a SGS) of the memory device 200. In addition, upper conductive structure(s) 204 of the stack structure 202 may be employed as upper select gate(s) (e.g., drain side select gate(s) (SGDs)) of the memory device 200. In some embodiments, horizontally neighboring conductive structures 204 of a vertically uppermost tier 208 of the stack structure 202 are employed as upper select gates (e.g., SGDs) of the memory device 200.

Referring to FIGS. 2A and 2B, the stack structure 202 may be partitioned in the Y-direction by filled slots 210. The filled slots 210 may, for example, vertically extend (e.g., in the Z-direction (FIG. 2B)) completely through the stack structure 202. The filled slots 210 may divide (e.g., in the Y-direction) the stack structure 202 into multiple blocks 212. As shown in FIG. 2B, the filled slots 210 may each individually be filled with at least one dielectric structure 214. The dielectric structure 214 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the dielectric structures 214 comprise Sift. Prior to being filled with the dielectric structures 214 to become the filled slots 210, preliminary slots may, for example, be employed to form the conductive structures 204 (FIG. 1A) of the stack structure 202 through so-called "replace gate" or "gate last" processing acts. For example, a preliminary stack structure including a vertically alternating sequence of sacrificial structures and preliminary insulating structures may be formed through conventional material deposition processes; the preliminary slots may be formed through at least the preliminary stack structure by way of one or more conventional material removal processes to form modified sacrificial structures and the insulating structures 206 (FIG. 2B); at least a portion of each of the modified sacrificial structures may be selectively removed by way of one or more additional conventional material removal processes to form recessed regions; and then the recessed regions may be at least partially (e.g., substantially) filled with conductive material to form the conductive structures 204 (FIG. 2B).

As shown in FIG. 2A, each of the blocks 212 may exhibit substantially the same width $W_3$ (e.g., horizontal dimension in the Y-direction) as one another. In addition, each of the blocks 212 may be separated (e.g., in the X-direction) from each other horizontally neighboring block 212 by substantially the same distance $D_3$ (e.g., corresponding to the width of each of the filled slots 210 (FIG. 2B)), such that the blocks 212 are substantially uniformly spaced from one another. Accordingly, a pitch $P_1$ (FIG. 2A) between centerlines of horizontally neighboring blocks 212 of the stack structure 202 may be substantially uniform throughout the stack structure 202.

For clarity and ease of understanding of the drawings and related description, FIGS. 2A and 2B show the stack structure 202 of the memory device 200 as including three (3) of the blocks 212 and two (2) of the slots 210. However, the stack structure 202 may include different quantities (e.g., amounts, numbers) of the blocks 212 (e.g., greater than three (3) of the blocks 212, less than three (3) of the blocks 212) and the slots 210 (e.g., greater than two (2) of the slots 210, less than two (2) of the slots 210), and/or may include a different distribution of the blocks 212 (and, hence, the slots 210). The quantities of blocks 212 and slots 210 included in the stack structure 202 at least partially depends on the quantities, dimensions, and arrangements of additional structures included in the memory device 200, as described in further detail below.

Referring to FIG. 2A, within horizontal boundaries (e.g., in the X-direction and the Y-direction) of the memory array region 202A of the stack structure 202, the memory device 200 may include vertically extending pillar structures 216. Each of the vertically extending pillar structures 216 may include a semiconductive pillar (e.g., a polysilicon pillar, a silicon-germanium pillar) at least partially surrounded by one or more charge storage structures (e.g., a charge-trapping structure, such as a charge-trapping structure comprising an oxide-nitride-oxide ("ONO") material; floating gate structures). Intersections of the vertically extending pillar structures 216 and the conductive structures 204 (FIGS. 2B and 2C) of the tiers 208 (FIGS. 2B and 2C) of the stack structure 202 (FIGS. 2B and 2C) may define vertically extending strings of memory cells 218 coupled in series with one another within the memory array region 202A of the stack structure 202. In some embodiments, the memory cells 218 formed at the intersections of the conductive structures 204 and the vertically extending pillar structures 216 within each the tiers 208 of the stack structure 202 comprise so-called "MONOS" (metal-oxide-nitride-oxide-semiconductor) memory cells. In additional embodiments, the memory cells 218 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 218 comprise so-called "floating gate" memory cells including floating gates (e.g., metallic floating gates) as charge storage structures. The floating gates may horizontally intervene between the central structures of the vertically extending pillar structures 216 and the conductive structures 204 of the different tiers 208 of the stack structure 202. The memory device 200 may include any desired quantity and distribution of the vertically extending pillar structures 216 within the memory array region 202A of the stack structure 202.

Referring collectively to FIGS. 2A through 2C, the memory device 200 may further include digit lines 220 (FIGS. 2A and 2C) (e.g., data lines, bit lines) vertically overlying the stack structure 202 and at least one source structure 222 (FIGS. 2B and 2C) (e.g., source line, source plate) vertically underlying the stack structure 202. The vertically extending pillar structures 216 may substantially vertically extend between the digit lines 220 and the source structure 222. The digit lines 220 and the source structure 222 may each individually be formed of and include at least one electrically conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide). The digit lines 220 and the source structure 222 may include substantially homogeneous distributions of the electrically conductive material, or may include substantially heterogeneous distributions of the electrically conductive material. If one or more of the digit lines 220 and the source structure 222 exhibit a substantially heterogeneous distribution of electrically conductive material, amounts of the electrically conductive material may vary stepwise (e.g., change abruptly), or may vary continuously (e.g., change progressively, such as linearly, parabolically) throughout different portions of the one or more of the digit lines 220 and the source structure 222. In some embodiments, the digit lines 220 and the source structure 222 each individually exhibit a substantially homogeneous distribution of electrically conductive material. In additional embodiments, one or more of at least one of the digit lines 220 and the source structure 222 exhibits a substantially heterogeneous distribution of at least one electrically conductive material. One or more of at least one of digit lines 220 and the source structure 222 may, for example, be formed of and include a stack of at least two different electrically conductive materials.

With continued reference to FIGS. 2A and 2C, within horizontal boundaries (e.g., in the X-direction) of the staircase region 202B of the stack structure 202, each of the blocks 212 of the stack structure 202 may include a staircase structure 224 at a horizontal end (e.g., in the X-direction) thereof. The staircase structure 224 of each of the blocks 212 of the stack structure 202 includes steps 226 at least partially defined by horizontal ends (e.g., in the X-direction) of the tiers 208. The steps 226 of the staircase structures 224 may serve as contact regions to electrically couple the conductive structures 204 (FIG. 2C) of the tiers 208 (FIG. 2C) of the stack structure 202 to other components (e.g., features, structures, devices) of the memory device 200, as described in further detail below. Each of the staircase structures 224 within the staircase region 202B of the stack structure 202 may individually include a desired quantity of steps 226. In addition, as shown in FIG. 2C, in some embodiments, the steps 226 of each of the staircase structures 224 are arranged in order, such that steps 226 directly horizontally adjacent (e.g., in the X-direction) one another correspond to tiers 208 of the stack structure 202 directly vertically adjacent (e.g., in the Z-direction) one another. In additional embodiments, the steps 226 of one or more of the staircase structures 224 are arranged out of order, such that at least some steps 226 of the staircase structures 224 directly horizontally adjacent (e.g., in the X-direction) one another correspond to tiers 208 of stack structure 202 not directly vertically adjacent (e.g., in the Z-direction) one another.

Still referring to FIGS. 2A and 2C, the memory device 200 may further include conductive contact structures 228 physically and electrically contacting at least some (e.g., each) of the steps 226 of the staircase structures 224 of the stack structure 202 to provide electrical access to the conductive structures 204 of the stack structure 202. The conductive contact structures 228 may be coupled to the conductive structures 204 of the tiers 208 of the stack structure 202 at the steps 226 of the staircase structures 224. As shown in FIG. 2C, the conductive contact structures 228 may physically contact and upwardly vertically extend (e.g., in the positive Z-direction) from the conductive structures 204 of the tiers 208 of the stack structure 202 at the steps 226 of the staircase structures 224. Each staircase structure 224 of each block 212 of the stack structure 202 may include at least one conductive contact structure 228 physically contacting each step 226 thereof; or one or more staircase structures 224 of one or more blocks 212 of the stack structure 202 may be free of at least one conductive contact structure 228 physically contacting at least one step 226 thereof.

In some embodiments, each of the conductive contact structures 228 individually exhibits a columnar shape (e.g., a circular column shape, a rectangular column shape, an ovular column shape, a pillar shape), and is sized and positioned to physically contact a single (e.g., only one) step 226 of a single (e.g., only one) staircase structure 224 (e.g., a staircase structure 224 of a single block 212) of the stack structure 202. In additional embodiments, one or more of the conductive contact structures 228 exhibits a different shape, a different size, and/or a different position.

The conductive contact structures 228 may be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively doped semiconductor material (e.g., conductively doped Si, conductively doped Ge, conductively doped SiGe). The conductive contact structures 228 may include substantially homogeneous distributions of the electrically conductive material, or may include substantially heterogeneous distributions of the electrically conductive material. If the conductive contact structures 228 exhibit substantially heterogeneous distributions of the electrically conductive material, amounts of the electrically conductive material may vary stepwise (e.g., change abruptly), or may vary continuously (e.g., change progressively, such as linearly, parabolically) throughout different portions of the conductive contact structures 228. In some embodiments, the conductive contact structures 228 each exhibit a substantially homogeneous distribution of electrically conductive material. In additional embodiments, one or more (e.g., each) the conductive contact structures 228 exhibits a substantially heterogeneous distribution of at least one electrically conductive material. One or more of the conductive contact structures 228 may, for example, be formed of and include a stack of at least two different electrically conductive materials.

Referring collectively to FIGS. 2B and 2C, optionally, the memory device 200 may further include conductive structures 230 physically contacting at least some of the conductive contact structures 228 of the memory device 200. For example, the conductive structures 230 may individually be sized, shaped, and positioned to physically contact and horizontally extend beyond horizontal boundaries of (e.g., in the X-direction, in the Y-direction) of a conductive contact structure 228 located on a step 226 of the stack structure 202. In some such embodiments, each of the conductive structures 230 individually physically contacts and horizontally extends past horizontal boundaries of one of the conductive contact structures 228 located one of the steps 226 of the stack structure 202. In additional embodiments, at least some (e.g., all) of the conductive structures 230 are omitted.

The conductive structures 230, if present, may be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively doped semiconductor material (e.g., conductively doped Si, conductively doped Ge, conductively doped SiGe). The conductive structures 230 may include substantially homogeneous distributions of the electrically conductive material, or may include substantially heterogeneous distributions of the electrically conductive material. If the conductive structures 230 exhibit substantially heterogeneous distributions of the electrically conductive material, amounts of the electrically conductive material may vary stepwise (e.g., change abruptly), or may vary continuously (e.g., change progressively, such as linearly, parabolically) throughout different portions of the conductive structures 230. In some embodiments, the conductive structures 230 each exhibit a substantially homogeneous distribution of electrically conductive material. In additional embodiments, one or more (e.g., each) the conductive contact structures 228 exhibits a substantially heterogeneous distribution of at least one electrically conductive material. One or more of the conductive structures 230 may, for example, be formed of and include a stack of at least two different electrically conductive materials.

With continued reference to FIGS. 2B and 2C, the memory device 200 may further include an isolation material 232 on or over the stack structure 202. The isolation material 232 may be vertically interposed (e.g., in the Z-direction) between the stack structure 202 and the isolation structure 102. As shown in FIG. 2C, the isolation material 232 may substantially cover the staircase structures 224 within the staircase region 202B of the stack structure 202, and may substantially surround side surfaces (e.g., sidewalls) of the conductive contact structures 228 on the steps 226 of the staircase structures 224. The isolation material 232 may exhibit a substantially planer upper vertical boundary, and a substantially non-planar lower vertical boundary complementary to the topography of at least the stack structure 202 (including the staircase structures 224 thereof) thereunder.

The isolation material 232 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). The isolation material 232 may include a substantially homogeneous distribution or a substantially heterogeneous distribution of the at least one dielectric material. In some embodiments, the isolation material 232 exhibits a substantially homogeneous distribution of dielectric material. In further embodiments, the isolation material 232 exhibits a substantially heterogeneous distribution of at least one dielectric material. The isolation material 232 may, for example, be formed of and include a stack (e.g., laminate) of at least two different dielectric materials. In some embodiments, the isolation material 232 is formed of and includes $SiO_2$.

Referring collectively to FIGS. 2A through 2C, the microelectronic device 100 according to embodiments of the disclosure may be located vertically above (e.g., in the Z-direction shown in FIGS. 2B and 2C) and at least partially (e.g., substantially) within horizontal boundaries (e.g., in the Y-direction and the X-direction shown in FIG. 2A) of the staircase region 202B of the stack structure 202. The microelectronic device 100 may serve as a string driver assembly (e.g., an HV string driver assembly) for the memory device 200. As described in further detail below, the transistors 124 (FIG. 2B) (e.g., driver transistors, such as string driver transistors) of the microelectronic device 100 may be electrically coupled to the conductive structures 204 of the stack structure 202 by way of the local contact structures 114, the conductive contact structures 228 (FIGS. 2A and 2C), and, if present, the conductive structures 230 (FIGS. 2B and 2C).

As shown in FIGS. 2A and 2C, multiple 2D material structures 106 of the microelectronic device 100 may vertically overlie (e.g., in the Z-direction shown in FIG. 2C) the stack structure 202. Different 2D material structures 106 of the microelectronic device 100 may, for example, individually vertically overlie and at least partially (e.g., substantially) be located within horizontal boundaries (e.g., the X-direction) of steps 226 of the staircase structures 224 within the staircase regions 202B of the stack structure 202. As shown in FIG. 2A, different 2D material structures 106 of the microelectronic device 100 may individually horizontally extend in the Y-direction across and between different steps 226 of the stack structure 202 horizontally neighboring one another in the Y-direction, and may be substantially confined within horizontal boundaries of the different, horizontally neighboring steps 226 in the X-direction. As a non-limiting example, as depicted in FIG. 2A, three (3) 2D material structures 106 of the microelectronic device 100 may be operatively associated with three (3) groups of steps 226 of the stack structure 202, wherein each of three (3) 2D material structure 106 individually vertically overlies and is located within horizontal boundaries (e.g., the X-direction) of one of the three (3) groups of steps 226, and each group of steps 226 individually includes different steps 226 of the stack structure 202 horizontally neighboring one another (e.g., the Y-direction) and located at substantially the same vertical position (e.g., in the Z-direction) as one another in the stack structure 202. A pitch $P_2$ between 2D material structures 106 of the microelectronic device 100 horizontally neighboring one another in the X-direction may be substantially equal to (e.g., substantially the same as) a pitch between steps 226 of the stack structure 202 horizontally neighboring one another in the X-direction.

With continued reference to FIGS. 2A and 2C, gate structures 118 of the microelectronic device 100 may vertically overlie and be positioned with horizontal boundaries (e.g., in the Y-direction) of the blocks 212 of the stack structure 202. As shown in FIG. 2A, the gate structures 118 of the microelectronic device 100 may extend substantially the same horizontal direction (e.g., the X-direction) as the blocks 212 of the stack structure 202, and may be located within horizontal boundaries of the blocks 212 of the stack structure 202 in the another horizontal direction (e.g., Y-direction) orthogonal to the horizontal direction in which the gate structures 118 and the blocks 212 extend. In some embodiments, centerlines of the gate structures 118 in the Y-direction are substantially aligned with centerlines of the blocks 212 in the Y-direction. A pitch between horizontally neighboring gate structures 118 (e.g., in the Y-direction) of the microelectronic device 100 may be substantially equal to (e.g., substantially the same as) the pitch $P_1$ (FIG. 2A) between horizontally neighboring blocks 212 (e.g., in the Y-direction) of the stack structure 202.

Referring next to FIGS. 2B and 2C, the local contact structures 114 of the microelectronic device 100 may vertically extend (e.g., in the Z-direction) from the 2D material structures 106 of the microelectronic device 100 to the conductive structures 230. For example, as shown in FIG. 2B, the local contact structures 114 may vertically extend from some of the second conductively doped regions 112 (e.g., the drain regions 112B) of the 2D material structures 106 to the conductive structures 230. The local contact structures 114 may contact (e.g., physically contact, electrically contact) the conductive structures 230. Accordingly, the local contact structures 114, the conductive structures 230, and the conductive contact structures 228 may electrically connect the transistors 124 (e.g., driver transistors, such as string driver transistors) of the microelectronic device 100 to the conductive structures 204 of the tiers 208 of the stack structure 202. As shown in FIGS. 2B and 2C, the local contact structures 114 may be located within horizontal boundaries (e.g., in the Y-direction (FIG. 2B) and in the X-direction (FIG. 2C)) of the conductive structures 230. In some embodiments, centerlines of at least some (e.g., all, less than all) of the local contact structures 114 in the X-direction (FIG. 2C) are offset from centerlines in the X-direction of the conductive structures 230 that the at least some of the local contact structures 114 contact (e.g., physically contact, electrically contact). In additional embodiments, centerlines of at least some (e.g., all, less than all) of the local contact structures 114 in the X-direction are substantially aligned with centerlines in the X-direction of the conductive structures 230 that the at least some of the local contact structures 114 contact (e.g., physically contact, electrically contact).

In additional embodiments, such as embodiments wherein the conductive structures 230 are omitted, the local contact structures 114 of the microelectronic device 100 may vertically extend (e.g., in the Z-direction) from the 2D material structures 106 to the conductive contact structures 228. In such embodiments, the local contact structures 114 are at least partially (e.g., substantially) located within horizontal boundaries (e.g., in the Y-direction (FIG. 2B) and in the X-direction (FIG. 2C)) of the conductive contact structures 228. Accordingly, the local contact structures 114 and the conductive contact structures 228 may electrically connect the transistors 124 of the microelectronic device 100 to the conductive structures 204 of the tiers 208 of the stack structure 202.

In further embodiments, one or more of the local contact structures 114 of the microelectronic device 100 may vertically extend (e.g., in the Z-direction) from the 2D material structures 106 to the steps 226 of the stack structure 202. By way of non-limiting example, the conductive contact structures 228 and the conductive structures 230 may be omitted, and each of the local contact structures 114 may individually contact one of the steps 226 of the stack structure 202. Accordingly, the local contact structures 114 may directly electrically connect the transistors 124 of the microelectronic device 100 to the conductive structures 204 of the tiers 208 of the stack structure 202.

While FIGS. 2A through 2C depict the microelectronic device 100 of the memory device 200 as being located within horizontal boundaries (e.g., in the X-direction, in the Y-direction) of the staircase region 202B of the stack structure 202 of the memory device 200, one or more portions of the microelectronic device 100 may be located outside of the horizontal boundaries of the staircase region 202B of the stack structure 202 of the memory device 200. For example, one or more portions (e.g., all, less than all) of one or more transistors 124 of the microelectronic device 100 may be located outside of the horizontal boundaries of the staircase region 202B of the stack structure 202. In such embodiments, the geometric configurations of one or more of the local contact structures 114, the conductive structures 230, and the conductive contact structures 228 connected (e.g., physically connected, electrically connected) to the one or more portions of the one or more transistors 124 may be modified relative to the geometric configurations depicted in FIGS. 2A through 2C to facilitate electrical connections between the one or more transistors 124 and one or more of the conductive structures 204 of the stack structure 202. As a non-limiting example, routes (e.g., paths) of one or more conductive structures 230 electrically connected to the one or more transistors 124 may be shaped to extend outside horizontal boundaries of the staircase region 202B of the stack structure 202 and to the local contact structures 114 in contact with the one or more transistors 124.

Thus, in accordance with additional embodiments of the disclosure, a memory device comprises a stack structure, a staircase structure, a string driver transistor, at least one additional conductive structure, and a string of memory cells. The stack structure comprises vertically alternating conductive structures and insulating structures arranged in tiers. The staircase structure is at a horizontal end of the stack structure. The staircase structure has steps comprising edges of the tiers. The string driver transistor vertically overlies the staircase structure and comprises a channel region comprising at least one 2D material. The at least one additional conductive structure extends from and between the string driver transistor and one of the steps of the staircase structure. The string of memory cells vertically extends through the stack structure.

Figure 3:
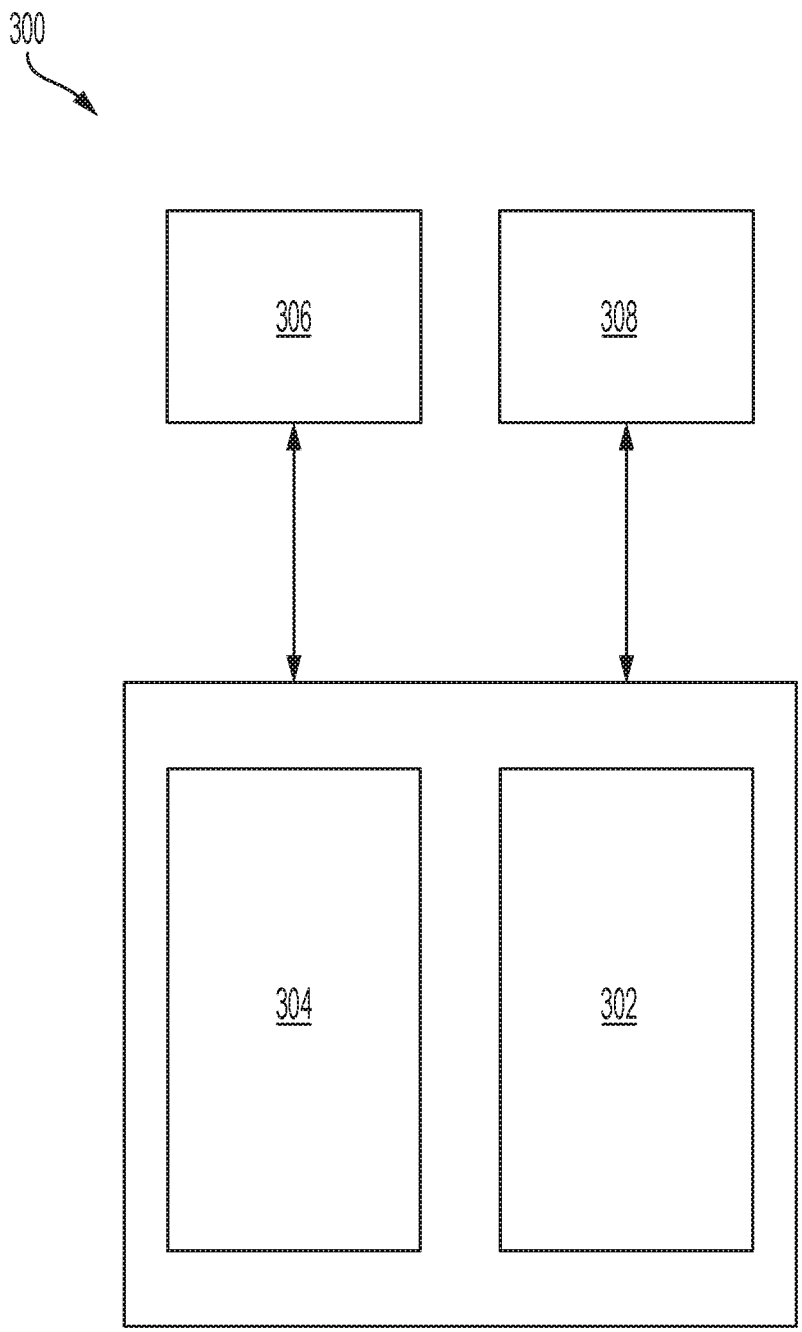
FIG. 3 is a schematic block diagram illustrating an electronic system, in accordance with embodiments of the disclosure.

Microelectronic devices (e.g., the microelectronic device 100 previously described with reference to FIGS. 1A through 1C) and memory devices (e.g., the memory device 200 previously described with reference to FIGS. 2A through 2C) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a microelectronic device (e.g., the microelectronic device 100 previously described with reference to FIGS. 1A through 1C) and a memory device (e.g., the memory device 200 previously described with reference to FIGS. 2A through 2C) previously described herein. The electronic system 300 may further include at least one electronic signal processor device 304 (often referred to as a "microprocessor"). The electronic signal processor device 304 may, optionally, include an embodiment of one or more of a microelectronic device (e.g., the microelectronic device 100 previously described with reference to FIGS. 1A through 1C) and a memory device (e.g., the memory device 200 previously described with reference to FIGS. 2A through 2C) previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include an embodiment of one or more of a microelectronic device (e.g., the microelectronic device 100 previously described with reference to FIGS. 1A through 1C) and a memory device (e.g., the memory device 200 previously described with reference to FIGS. 2A through 2C) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises a stack structure, contact structures, a microelectronic device, and vertically extending strings of memory cells. The stack structure has tiers comprising conductive structures and insulating structures vertically neighboring the conductive structures, and comprises a staircase region and a memory array region. The staircase region comprises staircase structures having steps comprising horizontal ends of the tiers. The memory array region horizontally neighbors the staircase region. The contact structures are on the steps of the staircase structures. The microelectronic device is electrically coupled to the contact structures and comprises transistors vertically overlying and within horizontal boundaries of the staircase region of the stack structure. Each of the transistors comprises a channel region comprising a 2D material, conductively doped regions neighboring opposing horizontal boundaries of the channel region and comprising the 2D material doped with at least one conductive dopant, and a gate structure vertically overlying and at least partially horizontally aligned with the channel region. The vertically extending strings of memory cells are within the memory array region of the stack structure.

The structures, devices, and systems of the disclosure advantageously facilitate one or more of improved simplicity, greater packaging density, and increased miniaturization of components as compared to conventional structures, conventional devices, and conventional systems. For example, the configurations of the microelectronic devices (e.g., the microelectronic device 100) of the disclosure facilitate robust memory device (e.g., the memory device 200) architectures exhibiting more components, less component congestion, and/or smaller horizontal dimensions as compared to conventional microelectronic devices and conventional memory devices. The structures, devices, and systems of the disclosure may increase performance, scalability, efficiency, reliability, and simplicity as compared to conventional structures, conventional devices, and conventional systems.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A transistor, comprising:
a 2D material structure conformally extending on and between surfaces of dielectric fin structures extending in parallel in a first horizontal direction, the 2D material structure comprising:
a source region;
a drain region;
a channel region positioned between the source region and the drain region in the first horizontal direction; and
lateral double-diffused regions positioned between the channel region and each of the source region and the drain region in the first horizontal direction; and
a gate structure overlying the channel region of the 2D material structure and extending in a second horizontal direction orthogonal to the first horizontal direction, the gate structure within horizontal boundaries of the channel region of the 2D material structure in the first horizontal direction.

2. The transistor of claim 1, wherein the 2D material structure comprises one or more of $WS_2$, $WSe_2$, $MoS_2$, and $MoSe_2$.

3. The transistor of claim 1, wherein the source region and the drain region of the 2D material structure are doped with at least one N-type dopant.

4. The transistor of claim 1, wherein the source region and the drain region of the 2D material structure are doped with at least one P-type dopant.

5. The transistor of claim 1, wherein the source region and the drain region of the 2D material structure are substantially undoped.

6. The transistor of claim 1, wherein:
the dielectric fin structures each individually exhibit an aspect ratio within a range of from about 0.1:1 to about 10:1; and
a ratio of a width of each of the dielectric fin structures to a distance between horizontally neighboring dielectric structures is within a range of from about 0.1:1 to about 10:1.

7. The transistor of claim 1, further comprising conductive structures downwardly vertically extending from the gate structure and alternating with the dielectric fin structures in the second horizontal direction.

8. The transistor of claim 1, further comprising a gate dielectric material interposed between the 2D material structure and each of the gate structure and conductive structures.

9. The transistor of claim 8, wherein a thickness of the gate dielectric material is within a range of from about 5 nm to about 10 nm.

10. The transistor of claim 1, wherein:
an electron mobility of the 2D material structure within a range of from about 150 $cm^2/V \cdot s$ to about 200 $cm^2/V \cdot s$; and
a bandgap of the 2D material structure is within a range of from about 1.8 eV to about 2.5 eV.

11. The transistor of claim 1, wherein the 2D material structure comprises one or more of a transition metal di-chalcogenide, a carbide, a carbonitride, graphene, graphene-oxide, stanine, phosphorene, hexagonal boron nitride, borophene, silicene, graphyne, germanene, germanane, a 2D supracrystal, and a monolayer of a semiconductive material.

12. The transistor of claim 1, wherein the 2D material structure comprises a transition metal di-chalcogenide having the general chemical formula $MX_2$, wherein M is selected from Mo, W, Nb, Zr, Hf, Re, Pt, Ti, Ta, V, Co, Cd, Cr, and wherein X is selected from S, Se, and Te.

13. The transistor of claim 1, wherein the 2D material structure comprises a carbide or carbonitride having the general chemical formula $M_{n+1}X_n$, wherein M is selected from Ti, Hf, Zr, V, Nb, Ta, and wherein X is selected from C and N.

14. A transistor, comprising:
- a 2D material structure conformally extending on and between surfaces of dielectric fin structures extending in parallel in a first horizontal direction, the 2D material structure comprising:
  - a source region;
  - a drain region; and
  - a channel region positioned between the source region and the drain region in the first horizontal direction;
- a gate structure overlying the channel region of the 2D material structure and extending in a second horizontal direction orthogonal to the first horizontal direction, the gate structure within horizontal boundaries of the channel region of the 2D material structure in the first horizontal direction; and
- conductive structures vertically extending from the gate structure toward the channel region of the 2D material structure, the conductive structures interposed between the dielectric fin structures in the second horizontal direction.

15. The transistor of claim 14, further comprising a gate dielectric material interposed between the 2D material structure and each of the gate structure and the conductive structures.

16. The transistor of claim 14, wherein each of the dielectric fin structures comprises aluminum oxide.

17. The transistor of claim 16, wherein each of the dielectric fin structures has a hexagonal crystal structure or a rhombohedral crystal structure.

18. The transistor of claim 14, wherein the 2D material structure has electron mobility within a range of from about 10 $cm^2$/V·s to about 400 $cm^2$/V·s.

19. The transistor of claim 18, wherein the 2D material structure has electron mobility within a range of from about 1.2 eV to about 2.5 eV.

20. The transistor of claim 14, wherein:
- the channel region of the 2D material structure has a first conductive contact on an upper surface through;
- the source region of the 2D material structure has a second conductive contact vertically extending therethrough; and
- the drain region of the 2D material structure has a third conductive contact vertically extending therethrough.

21. The transistor of claim 14, wherein a width of each of the conductive structures in the first horizontal direction is substantially equal to a width of the gate structure in the first horizontal direction.

* * * * *

UNITED STATES PATENT AND TRADEMARK OFFICE
CERTIFICATE OF CORRECTION

PATENT NO. : 11,127,747 B2
APPLICATION NO. : 16/549519
DATED : September 21, 2021
INVENTOR(S) : Kamal M. Karda et al.

It is certified that error appears in the above-identified patent and that said Letters Patent is hereby corrected as shown below:

In the Specification

Column 17, Line 20, change "Sift" to --$SiO_2$--

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*